(12) United States Patent
Ling et al.

(10) Patent No.: US 8,316,724 B2
(45) Date of Patent: Nov. 27, 2012

(54) MEASURING DEVICE INCLUDING A LAYER OF A MAGNETOELASTIC ALLOY AND A METHOD FOR PRODUCTION THEREOF

(75) Inventors: Hans Ling, Spånga (SE); Håkan F. Wintzell, Västerås (SE); Mingsheng Wang, Västerås (SE); Per S. Gustafsson, Västerås (SE); Andrius Miniotas, Västerås (SE)

(73) Assignee: ABB, AB, Västerås (SE)

( * ) Notice: Subject to any disclaimer, the term of this patent is extended or adjusted under 35 U.S.C. 154(b) by 592 days.

(21) Appl. No.: 12/282,352

(22) PCT Filed: Feb. 14, 2007

(86) PCT No.: PCT/SE2007/050088
§ 371 (c)(1),
(2), (4) Date: Feb. 2, 2009

(87) PCT Pub. No.: WO2007/106024
PCT Pub. Date: Sep. 20, 2007

(65) Prior Publication Data
US 2009/0249893 A1    Oct. 8, 2009

(30) Foreign Application Priority Data

Mar. 10, 2006  (SE) ...................................... 0600543

(51) Int. Cl.
*G01L 3/00* (2006.01)
(52) U.S. Cl. .................................................. 73/862.333
(58) Field of Classification Search ................... 73/862.331–862.338
See application file for complete search history.

(56) References Cited

U.S. PATENT DOCUMENTS

| | | | | |
|---|---|---|---|---|
| 4,984,046 A * | 1/1991 | Graeger et al. | ............... | 257/419 |
| 5,142,227 A | 8/1992 | Fish | | |
| 5,324,571 A * | 6/1994 | Koyama et al. | ............... | 428/212 |
| 5,585,574 A | 12/1996 | Sugibara et al. | | |
| 5,588,466 A | 12/1996 | Benz et al. | | |
| 6,258,185 B1 * | 7/2001 | Branagan et al. | ............... | 148/525 |
| 6,494,108 B1 | 12/2002 | Van Der Zaag et al. | | |
| 6,805,980 B2 * | 10/2004 | Uehara | ............... | 428/828 |
| 7,482,065 B2 * | 1/2009 | Branagan | ............... | 428/635 |

FOREIGN PATENT DOCUMENTS

EP    0299498 A1    1/1989

OTHER PUBLICATIONS

PCT/ISA/210—International Search Report—Jul. 18, 2007.
European Search Report issued in counterpart application 07709481.1—March 31, 2011.
Tang et al. "Synthesis and magnetostriction of melt-spun $Pr_{1-x}TB_x(Fe_{0.6}Co_{0.4})_2$ alloys", Journal of Applied Physics, vol. 91, No. 1; Jan. 1, 2003, pp. 271-273.

* cited by examiner

*Primary Examiner* — Lisa Caputo
*Assistant Examiner* — Octavia Davis-Hollington
(74) *Attorney, Agent, or Firm* — Venable LLP; Eric J. Franklin

(57) ABSTRACT

A measuring device including a layer of a magnetoelastic alloy formed on a load-carrying member. The layer is intended for measuring stresses induced by a force applied to the load-carrying member. An average grain size of the layer is in the range of 100 nm to 10000 nm. A method for production of the layer.

22 Claims, 3 Drawing Sheets

MEASURING DEVICE INCLUDING A LAYER OF A MAGNETOELASTIC ALLOY AND A METHOD FOR PRODUCTION THEREOF

CROSS-REFERENCE TO RELATED APPLICATIONS

This application claims priority to Swedish patent application 0600543-3 filed Mar. 10, 2006 and is the national phase under 35 U.S.C. §371 of PCT/SE2007/050088 Feb. 14, 2007.

FIELD OF THE INVENTION

The present invention relates to a measuring device including a layer of a magnetoelastic alloy formed on a load-carrying member, which layer is intended for measuring stresses induced by a force applied to the load-carrying member, and a method for production thereof. The force applied to the load-carrying member is, for example, a tensile force, a compressive force, or a torque.

The method according to the invention is useful for all types of measuring devices having a measuring layer on a load-carrying member. The measuring device measures stresses and/or strain in the layer, for example, induced by tensile forces, compressive forces, and torque applied to the load-carrying member. A measuring device according to the present invention may be used as a separate component in all such applications where for different reasons it is of interest to measure forces on a load-carrying member. The measuring device may, for example, be used to measure forces in, but not limited to, engines, cars, airplanes, jet engines, bicycles, gear boxes, power steering in cars, tools, propeller engines or helicopters.

PRIOR ART

Torque sensors of the type having a stress-measuring magnetoelastic or magnetostrictive layer formed on the surface of a load-carrying member, for example a shaft, are well known in the art. The purpose of the load-carrying member is to transfer load to the stress-measuring layer. A magnetoelastic material is a material that changes its permeability when it is loaded by a force. Examples of magnetoelastic materials are iron, nickel, cobalt and rare earth metals or alloys thereof. In this application the terms magnetoelastic and magnetostrictive are used synonymously. The magnetoelastic layer is formed on the surface of the member by different methods, for example by plating, thermal spraying, metal spraying, gun coating, welding, or gluing.

WO0144770 shows an example of a magnetostrictive sensor for measuring torque in a shaft, wherein the sensor comprises at least one active magnetostrictive region of the shaft. The magnetostrictive region includes one or more layers of a magnetostrictive material. The application of the layer is performed by plating. The plating may be followed by a stabilizing heat treatment at between 150° C. and 300° C. In certain applications a higher temperature may also be considered. This patent application refers to magnetostrictive material such as pure nickel, where a heating above 300° C. would lead to an increased linearity deviation as a consequence. Therefore, heating above 300° C. should be avoided for this type of sensor.

There is a desire to be able to measure mechanical stresses in a large load range. For example, in the car industry there is a desire to measure torque-induced shear stresses of a magnitude up to 200-300 MPa. Further, there is a desire to find a torque-measuring device that is long-time stable due to resistance against mechanical and thermal fatigue and is linear, i.e. the output signal from the measuring device is essentially proportional to the load on the load-carrying member. Further, there is a desire to reduce or even eliminate creeping in the output signal from the measuring device, i.e. the output signal should not change its value at a constant load. Hysteresis in the output signal should be avoided as it increases the measurement errors.

OBJECTS AND SUMMARY OF THE INVENTION

The object of the present invention is to provide a method for producing a layer on a load-carrying member, which makes it possible to manufacture an improved device for measuring stresses induced in the layer, with respect to one or more of the above-mentioned desires and without significantly altering important properties of the load carrying member.

This object is achieved by a method.

Such a method comprises: forming a nanocrystalline layer of a magnetoelastic alloy having an average grain size less than 50 nm on a surface of a member, and heat treating the layer until a crystallization of the alloy occurs and the average grain size becomes in the range of 100 nm to 10 000 nm.

Surprisingly, it has been discovered that heating of nanocrystal-line layers of magnetoelastic alloys of certain compositions, having an average grain size less than 50 nm, to a certain temperature, which depends on the composition of the alloy, causes a crystallization of the alloy, which drastically improves the stress measuring properties of the layer. It is essential that the temperature to which the alloy is heated is lower than the melting temperature of the alloy. Otherwise, the desired properties will not be obtained. Advantages achieved with the method according to the invention are that the measuring layer produced by the method is essentially linear over a large load range, has a low hysteresis, and has an improved stability against ageing and fatigue.

It has been proven by experiments that an alloy including iron, nickel and other alloying elements within certain ranges achieves the desired crystallization and obtains the desired properties, when they are heat treated to a temperature above 350° C., but less than the melting point of the layer. However, although not yet tested, it is most probable that other combinations of alloying elements in certain ratios would achieve the same result using the method according to the invention. The man skilled in the art may by due practice find out if the method works for other alloying elements as well, and within which ranges it works. For example, combinations of iron and cobalt, or nickel and cobalt would probably achieve the same result.

In order to achieve a linear behavior over a wide range of stress amplitudes, it is important to avoid saturation of magnetic induction thus implying the need for a moderate permeability. The energy density of magnetoelastic interaction with external stress is proportional to the energy density of magnetic interaction with an external magnetic field. This proportionality depends on magnetic properties such as saturation magnetic induction, saturation magnetostriction, the magnetizing field, stress, and furthermore the size of the magnetic domains. The magnetic domain size is proportional to the permeability. To design a material with a moderate permeability, a small domain size must be achieved. One way to obtain this is to tailor a microstructure of the material with a grain size large enough to accommodate a single domain, but small enough to accommodate just one, or a few. The smallest grain size when this occurs is in the order of fractions of micrometers. A nanocrystalline layer having an average grain size less than 50 nm provides favorable conditions for crystallization and tailoring the mentioned microstructure.

According to an embodiment of the invention, the average grain size of said layer is in the range of 100 nm to 5000 nm, preferably 100 nm to 1000 nm, most preferably 200 nm to 500 nm. Thus, more favorable conditions for the domain structure to coincide with the grain structure are created.

As described in "Handbook of Magnetic Materials, Vol. 10, 1997, ISBN 0444825991, Chapter 3 "Nanocrystalline soft magnetic alloys" by Herzer, pages 415-461, there is a relation between grain size and coercive force for magnetic alloys like Ni—Fe. This would mean that the advantageous grain sizes described above would have coercive forces within certain ranges.

According to an embodiment of the invention, the layer is heat-treated to a temperature above 300° C. but less than the melting point of the layer, preferably to a temperature in the range of 350° C. to 1000° C., most preferably to a temperature in the range of to 400° C. to 800° C. In order to achieve the desired crystallization, the layer must be heat-treated to a temperature above the crystallization temperature of the alloy. Thus, the temperature of the heat-treatment depends on the composition of the alloy. For example, for Ni—Fe-compositions of interest the crystallization temperature is in the range of 350° C.-450° C., and thus the temperature of the heat treatment must exceed this temperature. If the layer is heat-treated to a temperature in the range of 400° C. to 800° C., the preferred grain structure is easier to obtain.

According to an embodiment of the invention, the alloy includes iron in the range of 23-65 wt % (percent by weight), preferably 30-60 wt %, and most preferably 35-55 wt %. It has been proven that heat treatment of alloys, including iron in the range of 23-65 wt %, to a temperature above 350° C. reduces the linearity deviation of the layer and thereby improves its measuring properties. Heat treatment of alloys, including iron in the range of 30-60 wt %, to a temperature above 350° C. further reduces the linearity deviation and further improves the measuring properties of the alloy. Heat treatment of an alloy, including iron in the range of 35-55 wt %, to a temperature above 350° C. significantly reduces the linearity deviation and thereby significantly improves the measuring properties of the alloy. Tests have shown that heat treatment of alloys, including less than 20 wt % iron, to a temperature above 350° C. has the opposite effect, i.e. the linearity deviation increases, which results in worse measuring properties.

The resistance against mechanical and thermal fatigue requires thermodynamic stability and stable magnetic properties. The Ni—Fe-alloy system presents these properties in the alloying range between 23% and 65% Fe. In the alloying range up to 20% the thermodynamic stability is insufficient for high service temperatures, furthermore, around 20%-23% Fe properties like the magnetostriction and crystal anisotropy change sign and display a strong dependency on chemical composition and methods of manufacturing. Above 65% Fe in Ni the Invar alloy range is approached with unsuitable magnetoelastic properties for the objective of this invention.

According to an embodiment of the invention, the alloy further includes nickel in the range of 35-77 wt %, preferably 40-70 wt %, and most preferably 45-65 wt %. When an alloy, having a nickel and iron content within those ranges, is subjected to a heat treatment, according to the invention, a particularly advantageous Ni—Fe structure is formed, which has an average grain size within the desired interval and desired magnetic domains. This Ni—Fe structure has particularly advantageous magnetoelastic properties and thus improved measuring properties.

According to an embodiment of the invention, the alloy includes less than 10 wt % of one or more other alloying elements. The other alloying elements are for example cobalt, silicon, boron, sulphur, carbon, oxygen, nitrogen, aluminum, germanium, titanium, molybdenum, niobium, silver and copper. The alloy is allowed to include less than 10 wt % of other alloying elements in order to achieve the improved measuring properties.

According to an embodiment of the invention, the layer is heat-treated for a period of time less than 30 seconds. The heating time is not critical as long as the requirements on relative permeability and differential permeability are fulfilled. As soon as the crystallization has occurred the heating can be finished. The heat treatment should preferably be as fast as possible in order to avoid heating of the load-carrying member and thereby deteriorate its properties, such as the hardening of the member. It is advantageous to use induction heating for the heat treatment since it is fast and provides a local heating of the layer.

According to an embodiment of the invention, said layer is formed on the member by means of electroplating. Electroplating is a suitable method in order to achieve a nanocrystalline layer of the desired grain size.

According to an embodiment of the invention, the layer is heat-treated until a crystallization of the alloy occurs and the relative permeability becomes less than 500 and the maximum differential permeability becomes less than twice the relative permeability, both measured in a magnetizing field with an amplitude less than 1500 A/m. When those requirements on relative permeability and maximum differential permeability are fulfilled, the magnetization curve is essentially straight, which means that saturation of the magnetic induction does not occur. This is advantageous as a sensor with such a layer has an essentially linear output signal as a function of the load.

Another object of the present invention is to provide a measuring device including a layer of a magnetoelastic alloy formed on a load-carrying member, which device is improved with respect to one or more of the above-mentioned desires.

This object is achieved by a measuring device.

Such a measuring device is essentially linear over a large load range, has a low hysteresis, and has an improved stability against ageing and fatigue.

The invention is particularly useful for producing a sensor for measuring the torque of an engine or transmission, such as the engine or transmission of a car, as the torque sensor produced is linear in the desired load range for such an application.

BRIEF DESCRIPTION OF THE DRAWINGS

The invention will now be explained more closely by the description of different embodiments of the invention and with reference to the appended figures.

DETAILED DESCRIPTION OF PREFERRED EMBODIMENTS OF THE INVENTION

Figure 1:
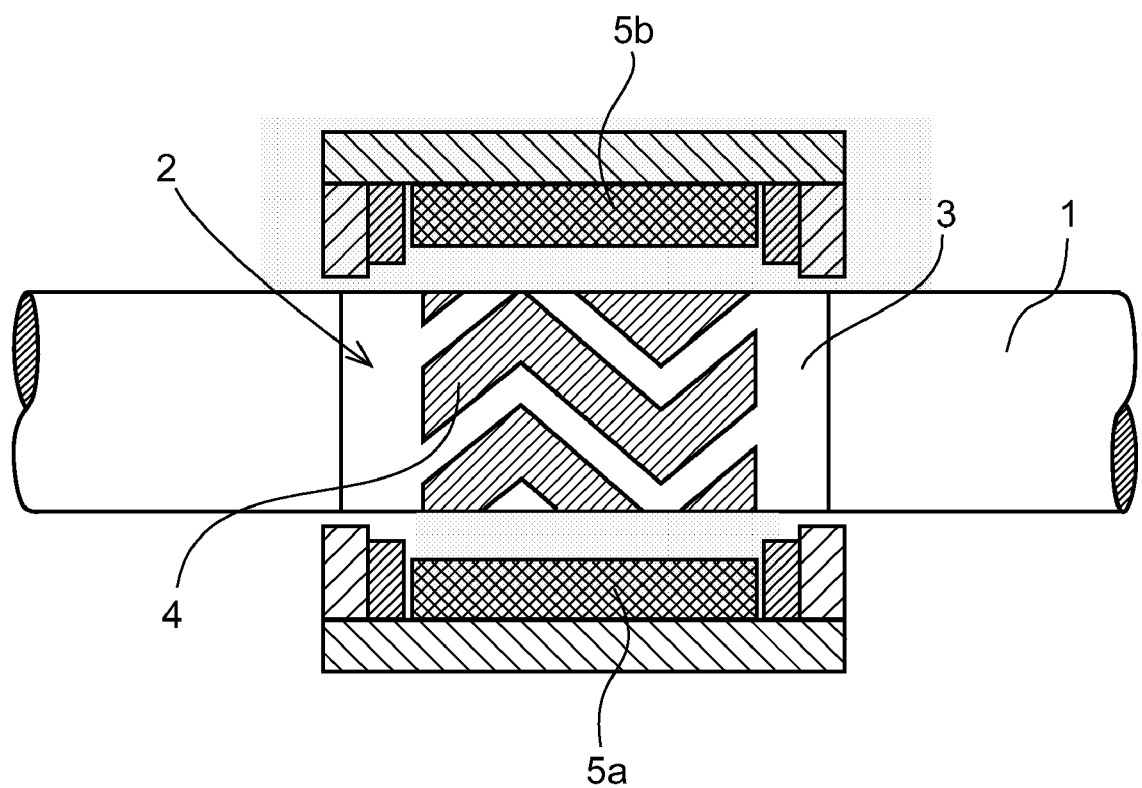
FIG. 1 shows an example of a measuring device including a load-carrying member covered with a magnetoelastic layer.

FIG. 1 shows an example of a measuring device including a load-carrying member, in the form of a rotary shaft 1, which is arranged to transmit a torque in any kind of mechanical transmission. The device is adapted to measure torques applied to the load-carrying member. The load-carrying member is made of a material with sufficient stiffness, for example of steel. A magnetoelastic region 2 is provided on the shaft 1. The magnetoelastic region 2 comprises a first layer 3 of a magnetoelastic material, which has a substantially continuous extension and thickness in said region 2. In this embodiment, the magnetoelastic layer 3 is formed by plating and is mainly composed of iron and nickel. A second layer 4 in the form of a continuous strip is provided on the first layer 3. The second layer 4 forms a surface pattern on the first layer 3. Further, the measuring device includes windings 5a-b supplying the measuring device with an alternating magnetization field. This type of measuring device is, for example, described in more details in the international patent application WO01/44770. The present invention relates to the first magnetoelastic layer 3 and to a method for producing such a layer.

DEFINITIONS

Relative permeability:

$$\mu_r = \frac{1}{\mu_0} \frac{\hat{B}}{\hat{H}}$$

where the maximum magnetizing field $\hat{H}$ is 1500 A/m and the magnetic induction $\hat{B}$ is measured for a non loaded layer.
Differential relative permeability, $$\mu_{diff} = \frac{1}{\mu_0} \frac{dB}{dH}$$

Maximum $\mu_{diff}$ is the largest differential relative permeability along the magnetization curve.
$\hat{H}$ is the maximum magnetizing field
$\hat{B}$ is the magnetic induction at $\hat{H}$
$\mu_0$ is the free space permeability
Hc, the coercive force, is the reverse magnetizing field needed to restore magnetic induction, B, to zero after saturation magnetization.
$V_f^{ic}$ is the volume fraction of the intercrystalline matter
According to the invention, a layer with improved measuring properties is achieved if the following conditions are fulfilled for measurements of a magnetic induction curve for the unloaded layer:

$$1000 > 2\mu_r > \mu_{diff} : \hat{H} < 1500 \frac{A}{m}$$

Thus, the requirement on $\mu_r$ is that $\mu_r$<500 and the requirement on $\mu_{diff}$ is that $\mu_{diff}$<2$\mu_r$ measured for a maximum magnetizing field less than 1500 A/m. When those requirements on $\mu_r$ and $\mu_{diff}$ are fulfilled, the magnetization curve is essentially straight, which means that saturation of the magnetic induction does not occur. This is advantageous as it is makes it possible to produce a sensor with such a layer, which sensor has a linear output signal as a function of the load.

In the following, a method for forming the magnetoelastic layer 3 on the member 1 will be described. In a first step, a nanocrystalline layer of a magnetoelastic alloy having an average grain size less than 50 nm is formed on the surface of the load-carrying member 1. An average grain size less than 50 nm is advantageous as it causes fast growth of the grains during the next step of the method. If the grain size is too large, the desired crystallization will not take place. Preferably, the layer should have an isotropic texture and isomorphic grain structure as this represents a good starting point for the desired crystallization.

In this embodiment example, the forming is made by means of electroplating. However, it is also possible to use other methods such as PVD (Physical Vapor Deposition) methods, CVD (Chemical Vapor Deposition) methods, metal spraying, detonation gun, welding, and gluing. The thickness of the layer is typically in the range of 10-500 μm. The average grain size of such a layer is less than 50 nm and for example between 10 nm and 15 nm. The magnetoelastic layer is, for example, composed of approximately 40 wt % of iron, approximately 60 wt % of nickel and less than 1 wt % of other alloying elements.

The layer formed by the plating is either nanocrystalline or amorphous, which is a metastable crystalline state. The layer is hard. High internal stress can occur in the layer. When the layer ages or when it is used at an increased temperature, the mechanical and magnetic properties of the layer are changing. The mechanical and magnetic properties also change when the layer is exposed to a repeated mechanical tension. This inclination to change the properties over the lifetime of the device is a bad quality for a sensor.

Figure 2:
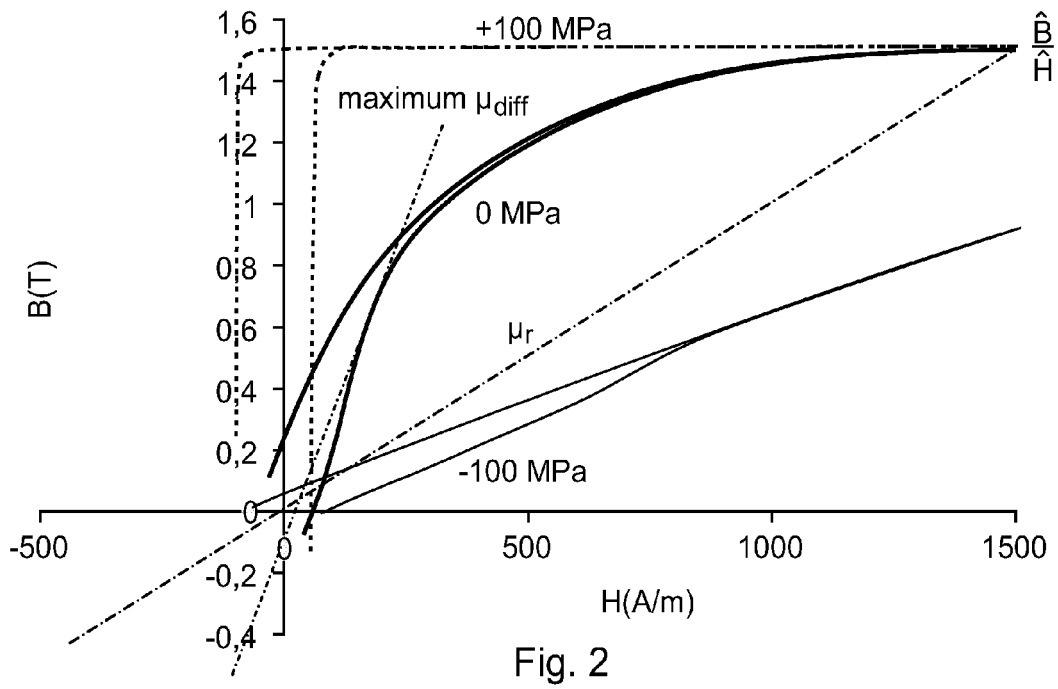
FIG. 2 shows an example of a magnetizing curve for a plated nanocrystalline magnetoelastic layer before heat treatment.

FIG. 2 shows magnetization curves, i.e. the BH curve, for three different loads on the magnetoelastic layer, measured after the layer has been formed on the member and before it has been heat-treated. The curve with a thin continuous line represents −100 MPa compressive stress. The dashed line represents +100 MPa tensile stress. The thick continuous line represents an unloaded 0 MPa layer. Magnetic induction saturation occurs when the BH curve is curved. As seen from the curves, magnetic induction saturation occurs already at zero load. For the zero load curve $\mu_r$ is about 800 and maximum $\mu_{diff}$ is about 5100. Thus, maximum $\mu_{diff} \approx 6.4\mu_r$. The magnetization curves are curved and do not fulfill the requirement on $\mu_r$ and $\mu_{diff}$. A disadvantage with having such a layer in a force measuring sensor is that the output signal becomes non-linear for large loads. Another disadvantage is that a sensor with this layer is not stable over long time due to poor resistance against mechanical and thermal fatigue.

In a second step the layer is heat-treated to a temperature in the range of 350° C. to 1000° C. It is enough to heat the layer until a crystallization of the alloy occurs. Typically, for an iron, nickel alloy this crystallization occurs when the layer reaches a temperature between 350 and 450° C. However, it is possible to heat the layer to a higher temperature and achieve the same type of crystallization, as long as the temperature is essentially below the melting temperature of the alloy. The desired crystallization occurs as soon as the alloy reaches the crystallization temperature. Further heating of the alloy only has a minor effect on the measuring properties. Thus, the time for the heat treatment is fast, less than 30 seconds and typically a few seconds, is enough to achieve the desired crystallization. It is important that the heat treatment is fast in order to avoid heating the load-carrying member, and thereby avoiding influencing the properties of the member. In order to avoid oxidation of the alloy, it is advantageous to use a protective gas during the heat treatment. However, it is not necessary to use a protective gas.

The heating of the layer is for example made by means of induction heating. An advantage with induction heating is that it is fast and concentrates the heating to the magnetoelastic layer, and thus avoids heating the load-carrying member. Other possible methods for heating the layer are for example, but not limited to, laser heating, oven heating, and infrared radiation heating.

During crystallization, a considerable growth of the grains occurs. The increase of the average grain size is about ten times the size before the crystallization. After crystallization, the average grain size becomes in the range of 100 nm to 1000 nm, preferably in the range of 200-500 nm. The mechanical and magnetic properties after the crystallization become more stable over time and also more stable when exposed to an increased temperature.

The structure of the electroplated material is usually nanocrystalline. Magnetic domain structure of magnetic nanocrystalline and amorphous materials are characterized by large domains, at least tenths of µm in one direction. Nanocrystalline materials are created under thermodynamically non-equilibrium conditions; hence they are in a thermodynamically metastable state. For example, nanocrystalline material having d=10 nm in grain size and D=1 nm in grain boundary is estimated to have 27.1% of intercrystalline matter according to formula $V_f^{ic}=1-[(d-D)/d]^3$. In that sense nanocrystalline materials can be treated as quenched. The order of the lattice and reducing volume of the intercrystalline matter, i.e. increasing size of crystallites reduces energy and hence makes the system more stable. For example, Ni—Fe nanocrystalline material is crystallizing upon heating and forming polycrystalline material with an average grain size equal or exceeding 100 nm.

The crystallization temperature and character in Ni—Fe alloys is dependent on iron concentration, but to our knowledge the onset of crystallization does not exceed 450° C. at Ni—Fe concentrations of interest. As already mentioned above the magnetic domain structure of nanocrystalline or amorphous material does not sense the crystallite structure of the material i.e. the magnetic domain wall interaction with crystallite boundary is very low. Upon crystallization, grains in the material start to become large enough and grain boundaries sharp enough for the magnetic domain to interact with them, which makes it energetically more favourable for the magnetic domain structure to break down into smaller domains. This is for example described in more detail in "Reviews on Advanced Materials Science", vol. 5, No. 2, p. 134-138, 2003 written by F. Ebrahimi and H. Q. Li and "IEEE Transactions on magnetics", vol. 27, No. 6, p. 4452-4457, 1991 by A. S. Kao and P. Kasiraj.

Figure 3:
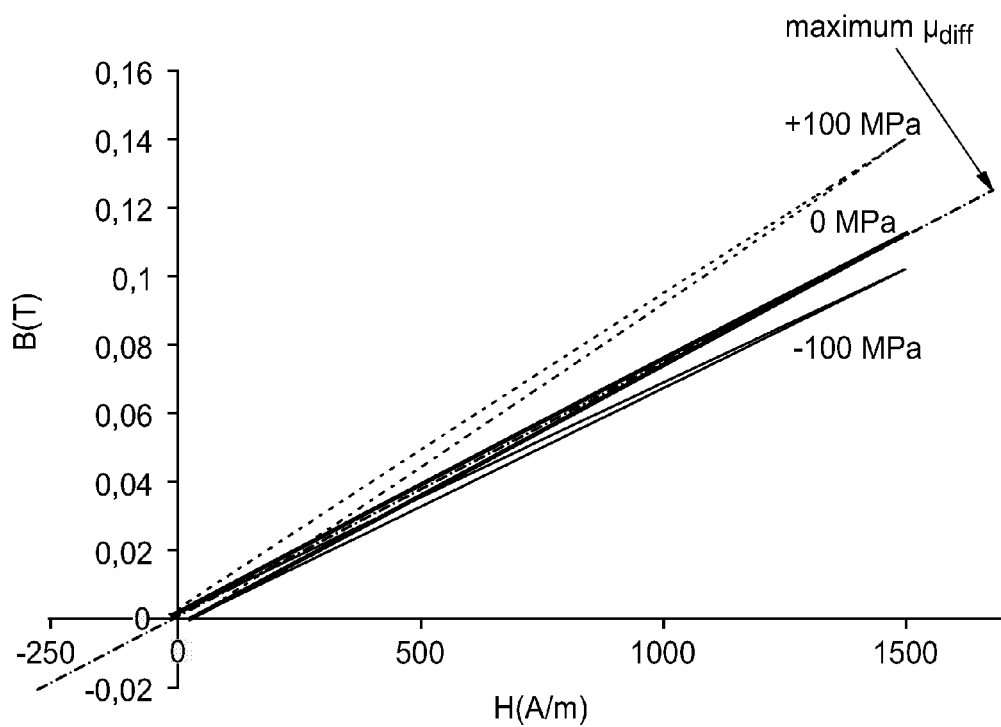
FIG. 3 shows an example of a magnetizing curve for the plated magnetoelastic layer after heat treatment to a temperature in the range of 350° C. to 1000° C.

FIG. 3 shows examples of magnetization curves for different loads on the magnetoelastic layer, measured after the layer has been heat-treated. The curve with a continuous line represents −100 MPa compressive stress. The dashed line represents +100 MPa tensile stress. The unloaded curve 0 MPa is the thick continuous line. As seen from the curves, magnetic induction saturation is not present. For zero load $\mu_r$ is about 60 and maximum $\mu_{diff}$ is 68. Thus, $\mu_r$ is about the same as the maximum $\mu_{diff}$. The magnetization curves are almost straight and fulfill the requirement on $\mu_r$ and $\mu_{diff}$.

Figure 4:
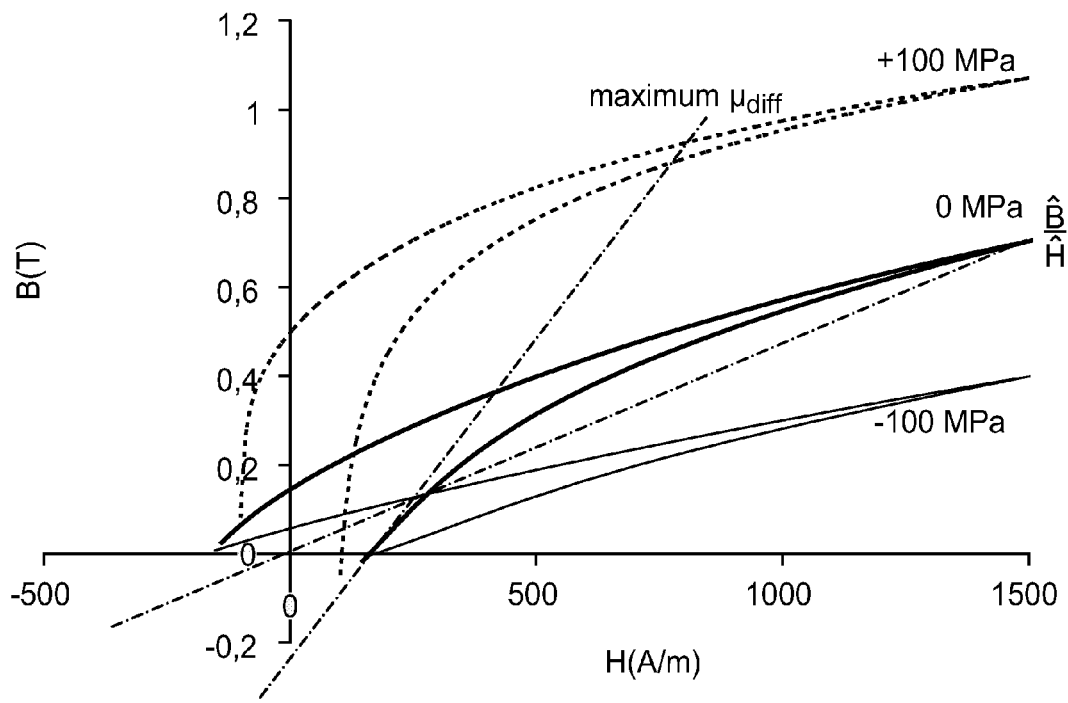
FIG. 4 shows an example of a magnetizing curve for the plated magnetoelastic layer after heat treatment to a temperature above 1000° C.

FIG. 4 shows magnetization curves for different loads on the magnetoelastic layer, measured after the layer has been heat-treated to a temperature above 1000° C. and below the melting temperature of the alloy. When the layer is heated to such a high temperature, the average grain size becomes larger than 1000 nm. When the grain particles become too large, the properties of the layer change and becomes less advantageous for stress measurements. The curve with a thin continuous line represents −100 MPa compressive stress and the dashed line represents +100 MPa tensile stress. The unloaded curve is the thick continuous line. As seen from the curves, magnetic induction saturation is beginning to appear. $\mu_r$ is about 375 and the maximum $\mu_{diff}$ is about 950. Thus, $\mu_r$ is less than 500, but $\mu_{diff}$ is more than twice the value of $\mu_r$. The magnetization curves are beginning to curve and do not fulfill both requirement on $\mu_r$ and $\mu_{diff}$. A disadvantage with having such a layer in a force measuring sensor is that the output signal becomes non-linear due to the load.

Figure 5:
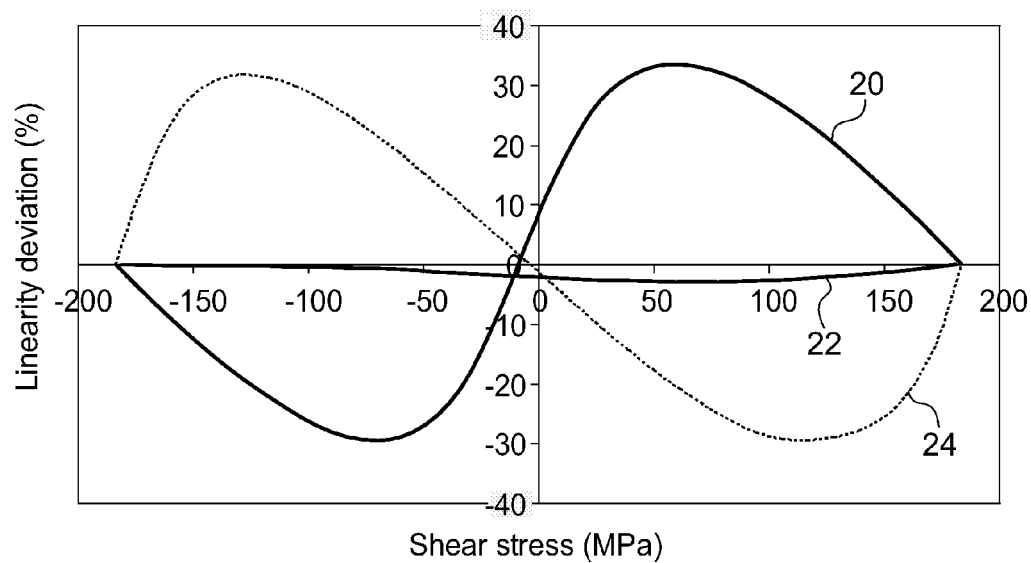
FIG. 5 is a diagram showing the linearity deviations as a function of the shear stress for different types of a magnetoelastic layer.

FIG. 5 shows the linearity deviation as a function of shear stresses applied to the load-carrying member for three different types of layer. The curve 20 is the output signal for a plated Ni—Fe layer, with 40% Fe, which is not heat-treated. The curve 22 is the output signal for a plated and heat-treated Ni—Fe layer, with 50% Fe, and the curve 24 is the output signal for a plated Ni layer, without Fe and not heat-treated. As seen from the figure, the linearity deviation is smallest for the heat-treated Ni—Fe layer. As the measuring layer, produced by the inventive method, is linear over a large load range, it is suitable for measuring torques in a large load range. For example, the invention makes it possible to produce a torque sensor that can measure shear stresses with high accuracy up to 300 MPa.

Through experiments it has been proven that a combination of good linearity over a wide load range, low load hysteresis, and long-term stability can be achieved for alloys of the claimed composition of and heat treatment. It has also been proved that Ni and Fe alloys with compositions outside the claimed ranges do not attain the desired properties, and that alloys heat-treated to a temperature outside the claimed temperature range do not attain the desired properties.

The term comprises/comprising when used in this specification is taken to specify the presence of stated features, steps or components. However, the term does not preclude the presence or addition of one or more additional features, steps or components or groups thereof.

The present invention is not limited to the embodiments disclosed but may be varied and modified within the scope of the following claims. For example it is possible to form the inventive layer without undergoing a crystallization process of a nanocrystalline layer, instead the layer can be directly formed with the desired grain size and magnetic properties, for example, by means of metal spraying.

The invention claimed is:

1. A method for producing a layer on a load-carrying member, which layer is intended for measuring stresses induced by a force applied to the load-carrying member, the method comprising:
    forming a nanocrystalline layer of a magnetoelastic alloy having an average grain size less than 50 nm on a surface of the member, and
    heat treating the layer until a crystallization of the alloy occurs and the average grain size becomes in a range of 100 nm to 10000 nm.

2. The method according to claim 1, wherein the average grain size of said layer is in a range of 100 nm to 5000 nm.

3. The method according to claim 1, wherein the layer is heat-treated to a temperature above 300° C. but less than a melting point of the layer.

4. The method according to claim 1, wherein the alloy includes iron in a range of 23-65 wt %.

5. The method according to claim 4, wherein the alloy includes nickel in a range of 35-77 wt %.

6. The method according to claim 4, wherein the alloy includes less than 10 wt % of one or more other alloying elements.

7. The method according to claim 1, wherein the layer is heat-treated until a crystallization of the alloy occurs and a relative permeability becomes less than 500 and a maximum differential permeability becomes less than twice the relative permeability, both measured in a magnetizing field with an amplitude less than 1500 A/m.

8. The method according to claim 1, wherein the heat treatment comprises induction heating.

9. The method according to claim 1, wherein said layer is formed on the member by electroplating.

10. The method according to claim 1, wherein the layer is heat-treated for a period of time that is less than 30 seconds.

11. The method according to claim 1, wherein the layer is intended for measuring stresses induced by a torque applied on the load-carrying member.

12. The method according to claim 1, further comprising: producing a torque sensor.

13. The method according to claim 1, further comprising: producing a force sensor.

14. A measuring device, comprising:
a layer of a magnetoelastic alloy formed on a load-carrying member which layer is intended for measuring stresses induced by a force applied to the load-carrying member wherein an average grain size of said layer is in a range of 200 nm to 10000 nm.

15. The device according to claim 14, wherein the average grain size of said layer is in a range of 200 nm to 5000 nm.

16. The device according to claim 14, wherein the alloy includes iron in a range of 23-65 wt %.

17. The device according to claim 16, wherein the alloy includes nickel in a range of 35-77 wt %.

18. The device according to claim 16, wherein the alloy includes less than 10 wt % of other alloying elements.

19. The device according to claim 14, wherein a relative permeability is less than 500 and a maximum differential permeability is less than twice the relative permeability, both measured in a magnetizing field with an amplitude less than 1500 A/m.

20. The device according to claim 14, wherein said stress measuring layer is obtained by forming a nanocrystalline layer of a magnetoelastic alloy having an average grain size less than 50 nm on a surface of said load-carrying member, and heat treating the layer to a temperature above 300° C. but less than a melting point of the layer, until a crystallization of the alloy occurs.

21. The device according to claim 14, wherein the measuring device is a torque sensor.

22. The device according to claim 14, wherein the measuring device is a force sensor.

* * * * *